(12) United States Patent
Lin et al.

(10) Patent No.: US 9,147,100 B1
(45) Date of Patent: Sep. 29, 2015

(54) METHOD FOR ENHANCING SURFACE CHARACTERISTICS OF A FINGERPRINT SENSOR AND STRUCTURE MADE OF THE SAME

(71) Applicant: SunASIC Technologies, Inc., New Taipei (TW)

(72) Inventors: Chi-Chou Lin, New Taipei (TW); Zheng-Ping He, New Taipei (TW)

(73) Assignee: Sunasic Technologies Inc., New Taipei (TW)

( * ) Notice: Subject to any disclaimer, the term of this patent is extended or adjusted under 35 U.S.C. 154(b) by 0 days.

(21) Appl. No.: 14/273,743

(22) Filed: May 9, 2014

(51) Int. Cl.
| | |
|---|---|
| *H01L 27/14* | (2006.01) |
| *G06K 9/00* | (2006.01) |
| *H01L 23/31* | (2006.01) |
| *H01L 23/29* | (2006.01) |
| *H01L 27/02* | (2006.01) |
| *H01L 31/0236* | (2006.01) |

(52) U.S. Cl.
CPC .......... *G06K 9/00053* (2013.01); *G06K 9/0002* (2013.01); *H01L 23/29* (2013.01); *H01L 23/3157* (2013.01); *H01L 27/0248* (2013.01); *H01L 31/02366* (2013.01)

(58) Field of Classification Search
CPC . H01L 23/3157; H01L 23/3192; H01L 23/29; H01L 23/60; H01L 27/0248; H01L 31/0216; H01L 31/0232; H01L 31/02366; G06K 9/00053; G06K 9/0002
USPC .......................... 257/414, 417, 487; 382/124
See application file for complete search history.

(56) References Cited

U.S. PATENT DOCUMENTS 7,397,096 B2 *  7/2008  Chou et al. .................... 257/414

\* cited by examiner

*Primary Examiner* — Tu-Tu Ho
(74) *Attorney, Agent, or Firm* — Che-Yang Chen; Law Office of Michael Chen (57) ABSTRACT

A method for enhancing surface characteristics of a fingerprint sensor and a protective structure made according to the method are disclosed. The method includes the steps of: providing a fingerprint sensor having a number of detecting elements beneath a top surface of the fingerprint sensor, the detecting element is used to detect changes of capacitance over a portion of a finger; forming a metal mesh layer over the top surface of the fingerprint sensor, wherein metal lines of the metal mesh layer are formed periodically and each of them is located between two adjacent detecting elements; forming a passivation layer on the metal mesh layer to shape a concave-convex top surface; and filling concave portions of the passivation layer with a Diamond-Like Carbon (DLC) material. A convex portion of the passivation layer is substantially above the metal line of the metal mesh layer.

18 Claims, 9 Drawing Sheets

METHOD FOR ENHANCING SURFACE CHARACTERISTICS OF A FINGERPRINT SENSOR AND STRUCTURE MADE OF THE SAME

FIELD OF THE INVENTION

The present invention relates to a method for enhancing surface characteristics. More particularly, the present invention relates to a method for enhancing surface characteristics of a fingerprint sensor.

BACKGROUND OF THE INVENTION

A fingerprint sensor is an electronic device used to capture a digital image of the fingerprint pattern. There are many types of fingerprint sensors, such as optical type, ultrasonic type and capacitance type. Among all of them, the capacitance type fingerprint sensor is getting popular recently for its compact size, workability and good cost structure.

Capacitance type fingerprint sensors use principles associated with capacitance in order to form fingerprint images. They are packaged semiconductors with one side exposed to the external environment. The exposed side is used to fetch the fingerprint images. The surface of the fingerprint sensor therefore may lead electrostatics around itself and cause Electrostatic Discharge (ESD) inside and bears pressure from the fingers.

Figure 1:
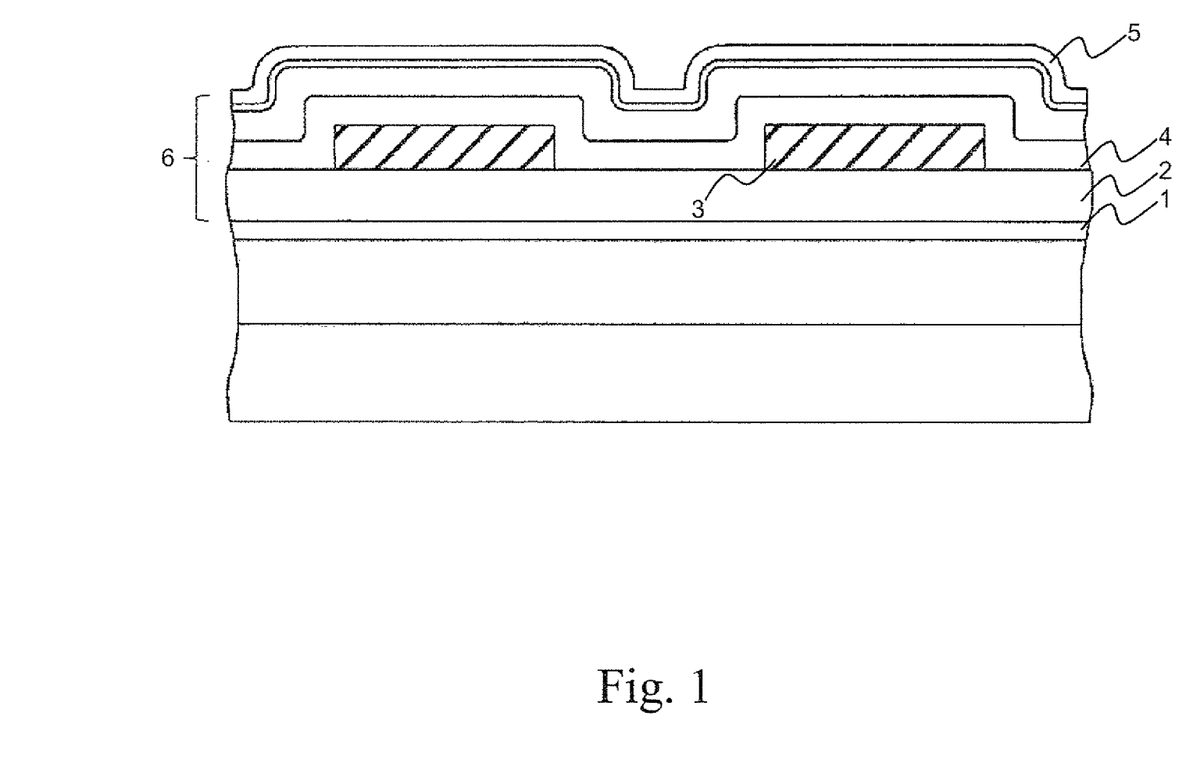
FIG. 1 illustrates a conventional ESD protection structure.

In order to settle the mentioned problems, there are many prior arts providing practical method to form protective structures for the fingerprint sensor. For ESD protection, please refer to FIG. 1. U.S. Pat. No. 6,091,082 discloses a structure and method for creating a passivation to protect an integrated circuit. The structure includes a circuit 1, a dielectric 2, and metal plates 3 over which an insulating layer 4 is disposed that electrically and hermetically isolates the circuit 1. A discharge layer 5 is deposited to form a passivation 6 that protects the circuit 1 from ESD caused by a finger. Although the structure can provide ESD protection, the passivation 6 is not rigid enough to resist scratches. Meanwhile, oil and water can easily attach to the passivation 6 to cause residual of the fingerprint.

Figure 2:
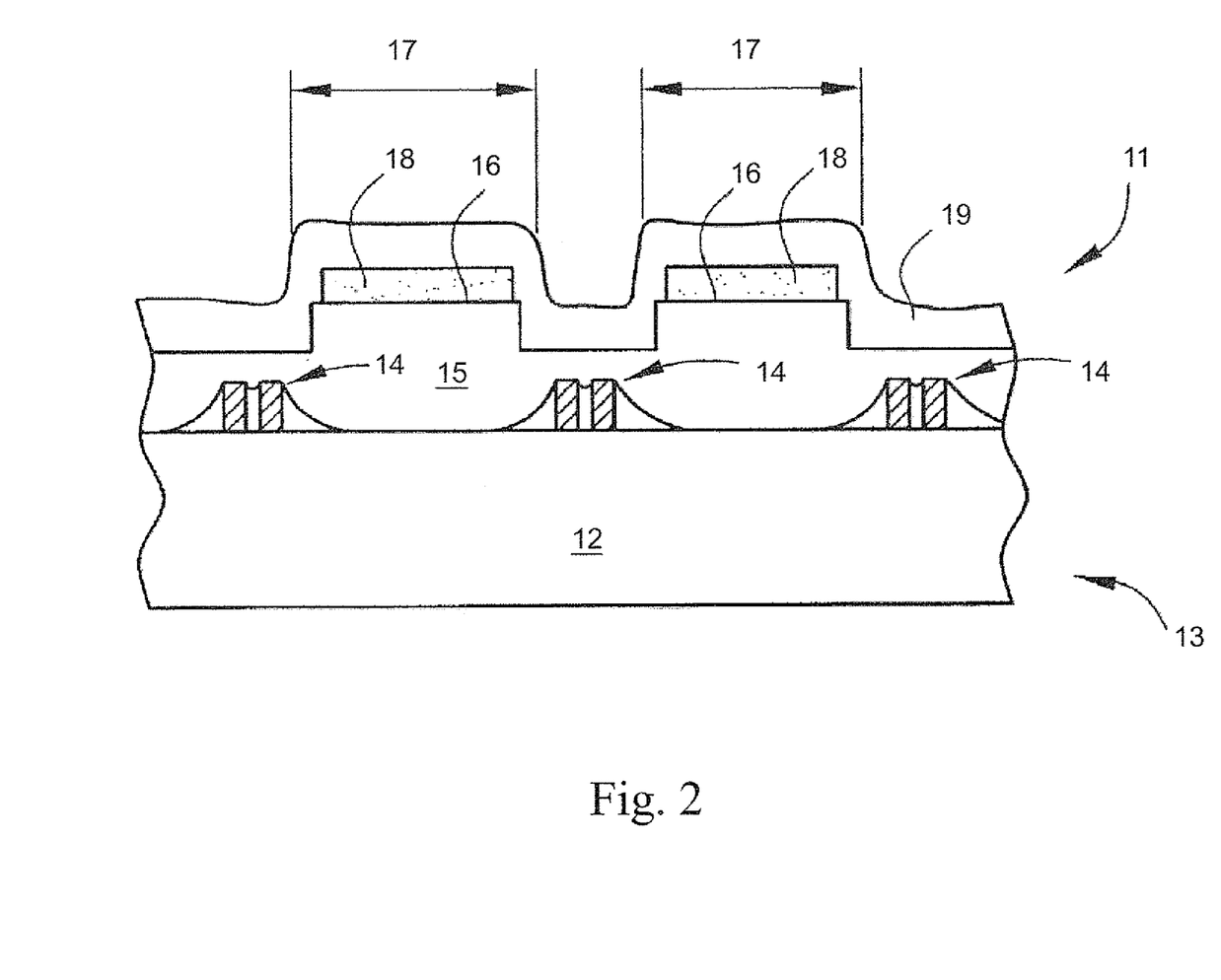
FIG. 2 illustrates another conventional ESD protection structure.

Another improvement for ESD protection is provided in U.S. Pat. No. 6,310,371. Please refer to FIG. 2. The invention provides a fingerprint sensor chip 11 formed on a first dielectric layer 12 of a semiconductor wafer 13. The fingerprint sensor chip 11 includes a number of rectangular sensor areas 17 arranged in a matrix format which are surrounded by conductors 14, a second dielectric layer 15 covering the sensor areas 17 and the conductors 14 where the surface of the second dielectric layer 15 positioned above each of the sensor areas 17 is formed as a protruding rectangular platform 16 with a shallow trench around the platform 16, a rectangular metal plate 18 positioned on top of each of the rectangular platforms 16 which is used as a sensor plate of the fingerprint sensor chip 11, and a protective layer 19 positioned on the surface of the semiconductor wafer 13 to cover and protect the underlying circuitry. Although '371 has better ESD protection, concaveness of protective layer 19 may stick dusts. This results in poor performance of the fingerprint sensor chip 11 after it is used for a period of time.

Figure 3:
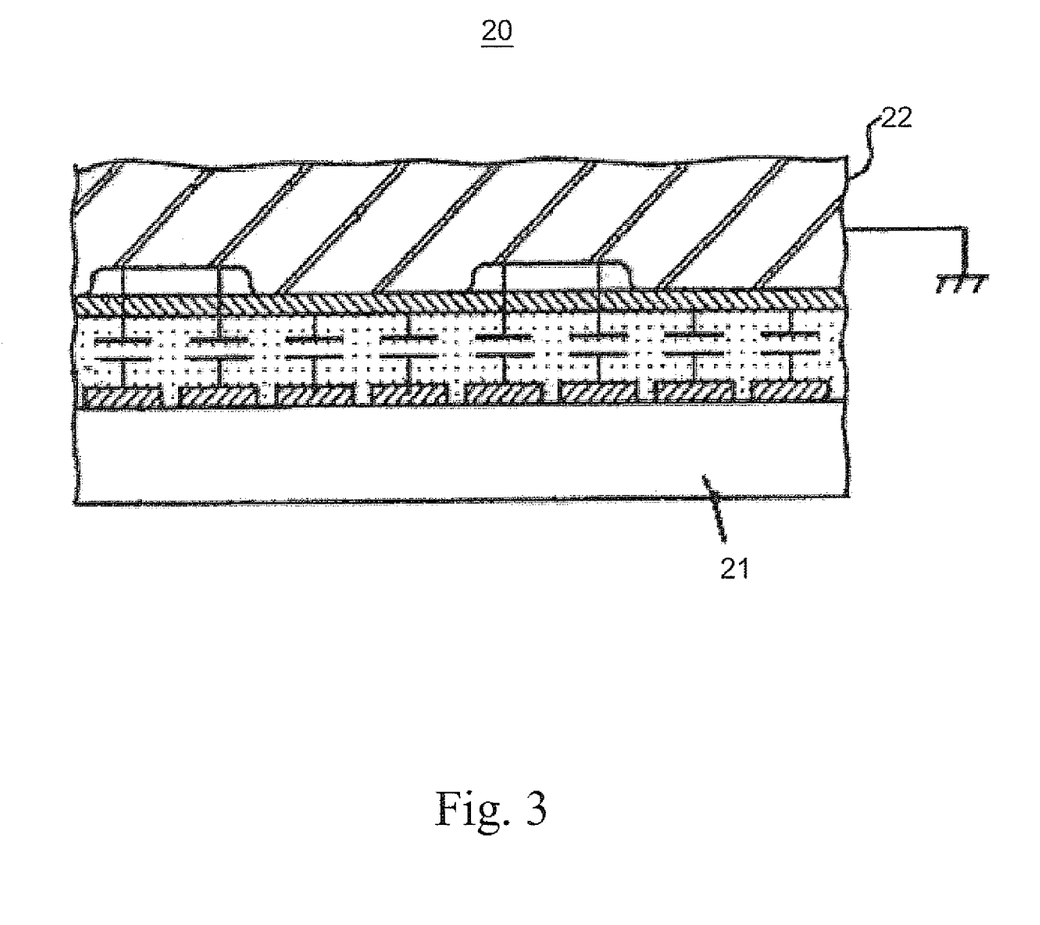
FIG. 3 shows a conventional fingerprint detection device providing resistance against pressure from external environment.

As to resistance against pressure, U.S. Pat. No. 7,629,200 discloses a fingerprint detection device. Please refer to FIG. 3. The fingerprint detection device 20 has a fingerprint sensor chip 21 and a diamond-like carbon (DLC) film 22 covering the outermost surface of the sensor chip. The DLC film 22 provides sufficient strength and enhanced electrostatic discharge withstand voltage to the fingerprint sensor chip 21. Thus, the DLC film protects the fingerprint sensor chip 21 without any conventional protective cover. The DLC film 22 is less scratchable and less stainable. Since the fingerprint detection device 20 has no protective cover, the device can be provided in a thin and compact form. In addition, the device has high reliability. However, the DLC film 22 might not be easily attached to the fingerprint sensor chip 21. In addition, the DLC film 22 may crack due to external compact or temperature difference between itself and the fingerprint sensor chip 21.

After the introduction of prior arts for protection of fingerprint sensors is illustrated, it is necessary to provide a protective structure for fingerprint sensors with good ESD protection, excellent resistance against pressure, and stain-proof and water-proof surface. Most of all, the protective structure is free from cracking of its compositions.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a method for enhancing surface characteristics of a fingerprint sensor includes the steps of: providing a fingerprint sensor having a number of detecting elements beneath a top surface thereof, the detecting element being used to detect changes of capacitance over a portion of a finger; forming a metal mesh layer over the top surface of the fingerprint sensor, wherein metal lines of the metal mesh layer are formed periodically and each of them is located between two adjacent detecting elements; forming a passivation layer on the metal mesh layer to shape a concave-convex top surface; and filling concave portions of the passivation layer with a Diamond-Like Carbon (DLC) material. A convex portion of the passivation layer is substantially above the metal line of the metal mesh layer.

In accordance with another aspect of the present invention, a structure for enhancing surface characteristics of a fingerprint sensor includes: a metal mesh layer, over a top surface of a fingerprint sensor, for providing Electrostatic Discharge (ESD) protection for the fingerprint sensor; a passivation layer, formed on the metal mesh layer to shape a concave-convex top surface thereon; and DLC protective portions, formed of a DLC material, formed in the concave portions of the passivation layer. The fingerprint sensor has a number of detecting elements beneath a top surface thereof; the detecting element is used to detect changes of capacitance over a portion of a finger; metal lines of the metal mesh layer are formed periodically and each of them is located between two adjacent detecting elements; a convex portion of the passivation layer is substantially above the metal line of the metal mesh layer.

Preferably, the passivation layer is made of $SiO_2$, $Al_2O_3$, SIC, SiN or a Polyimide (PI). The metal mesh layer is made of aurum, aluminum, copper, aluminum alloy or copper alloy. A distance between two adjacent metal lines is 10 to 50 μm. A height of the metal line is at least 1 μm. A width of the metal line is at least 1 μm. A thickness of concave portions of the passivation layer is around 1 μm. A thickness of convex portions of the passivation layer is around 1 μm. The DLC material can further include hydrogen or nitrogen to adjust hardness of itself.

DETAILED DESCRIPTION OF THE PREFERRED EMBODIMENT

The present invention will now be described more specifically with reference to the following embodiment.

Figure 4:
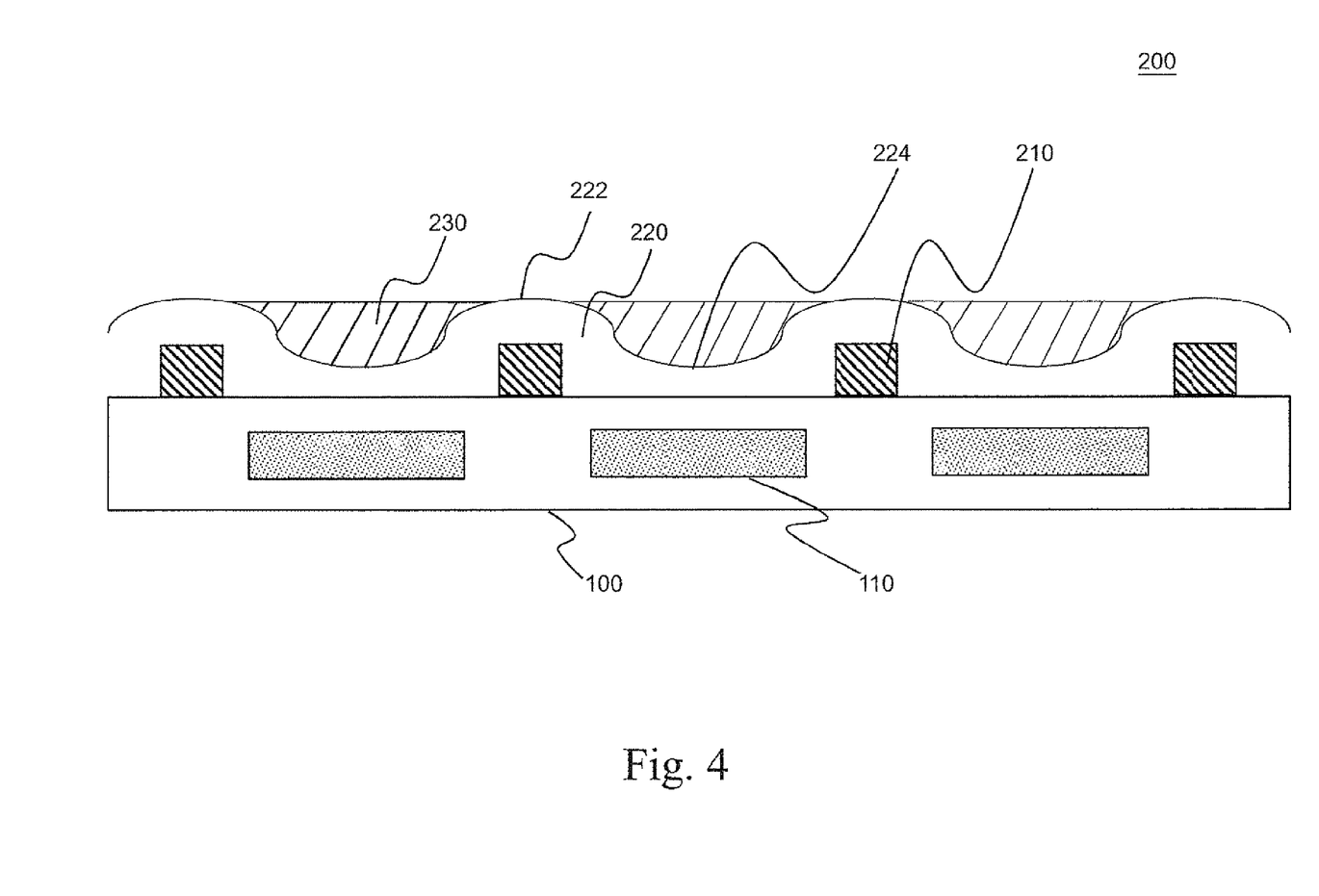
FIG. 4 shows a protective structure for enhancing surface characteristics of a fingerprint sensor according to the present invention.
Figure 5:
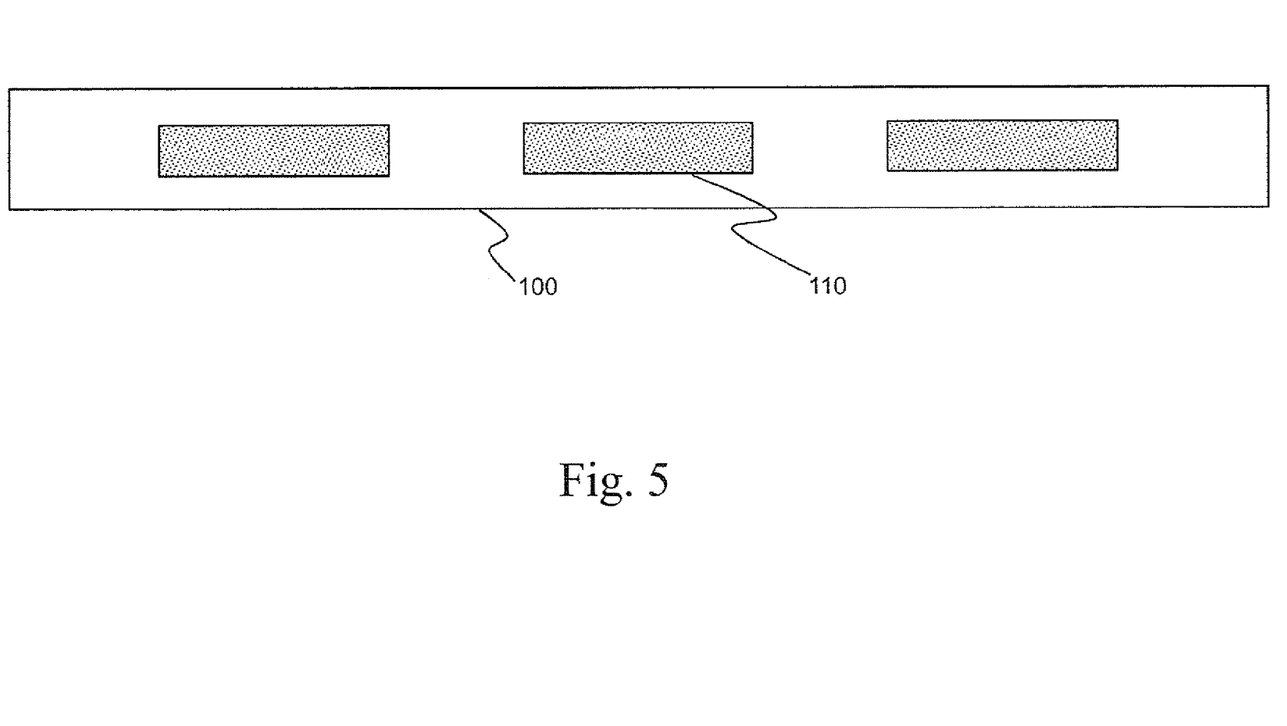
FIG. 5 illustrates a step of a method to enhance surface characteristics of a fingerprint sensor according to the present invention.
Figure 6:
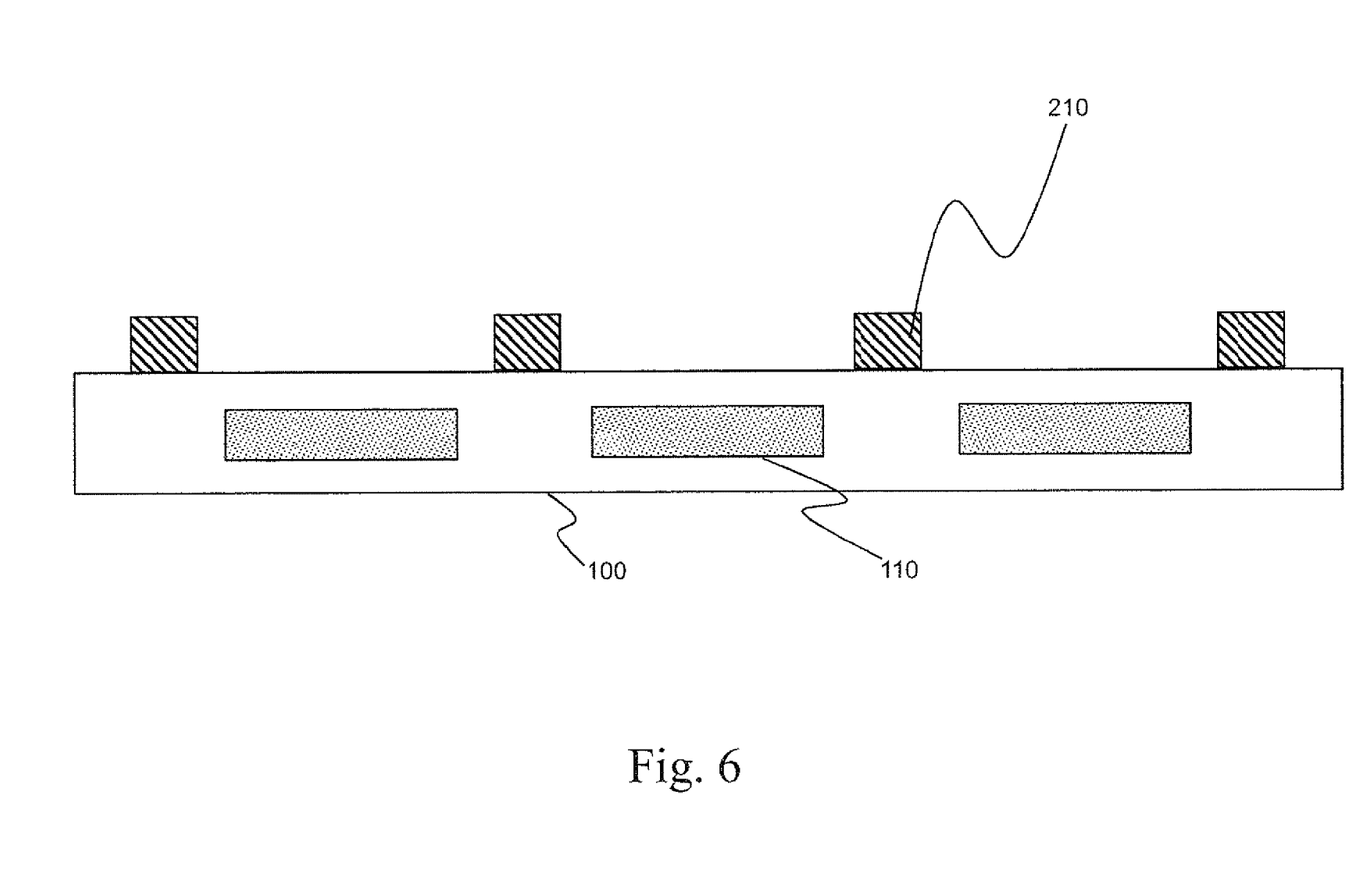
FIG. 6 illustrates another step of the method.
Figure 7:
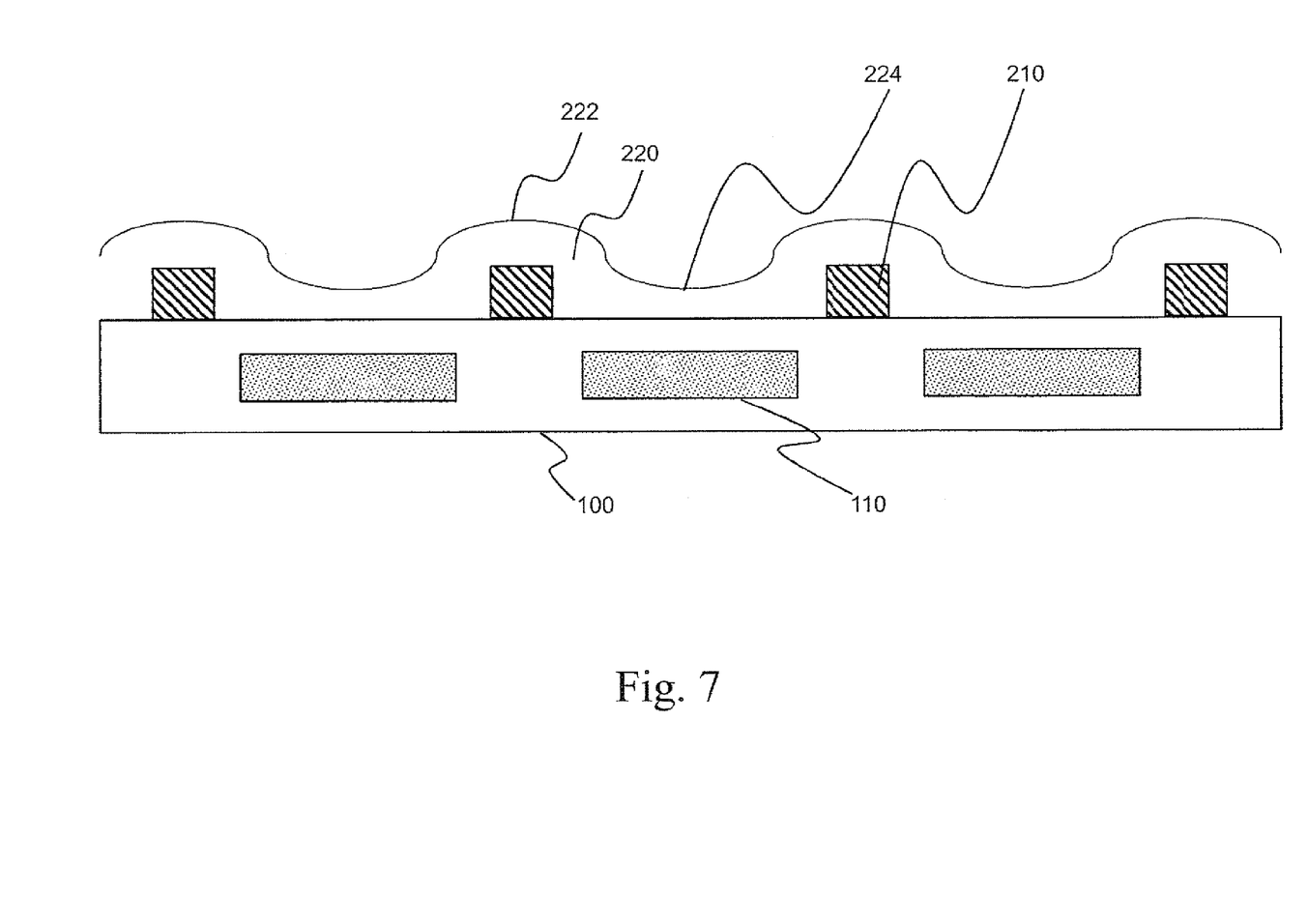
FIG. 7 illustrates still another step of the method.
Figure 8:
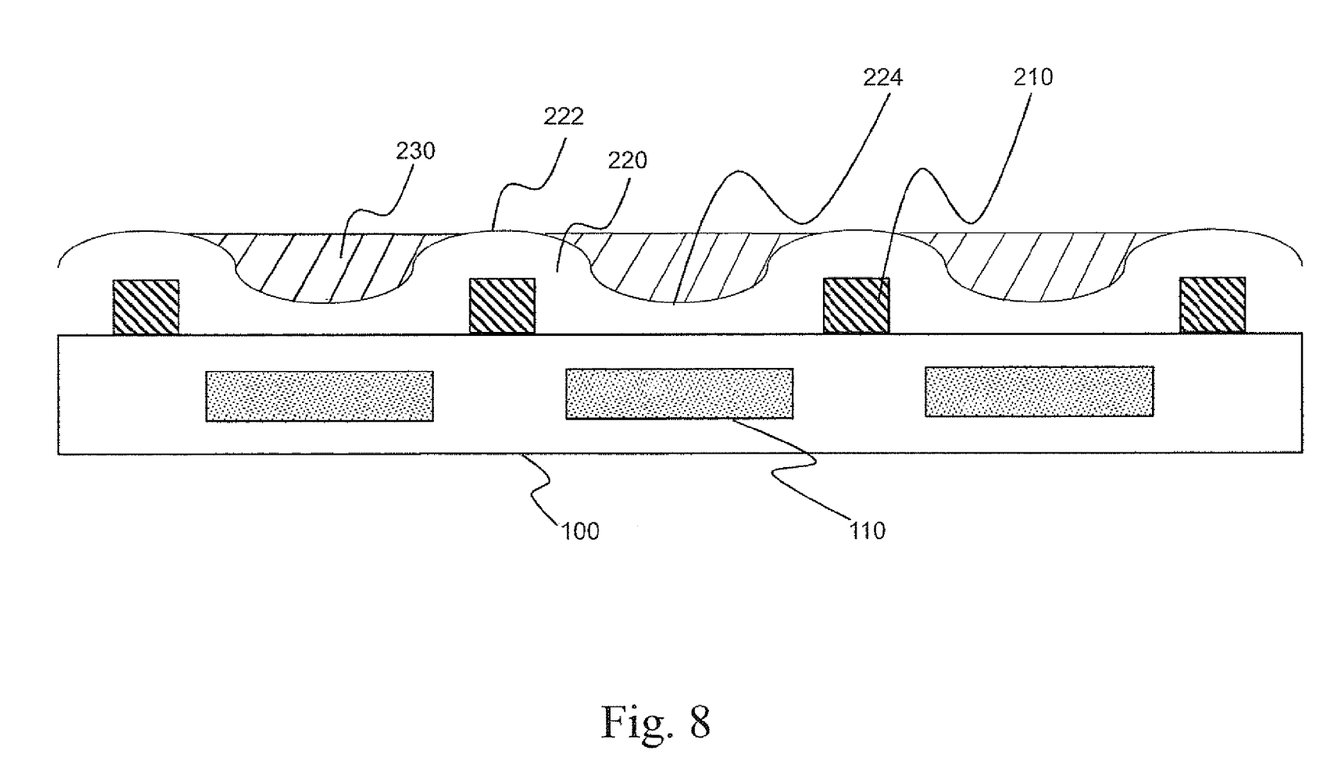
FIG. 8 illustrates still another step of the method.
Figure 9:
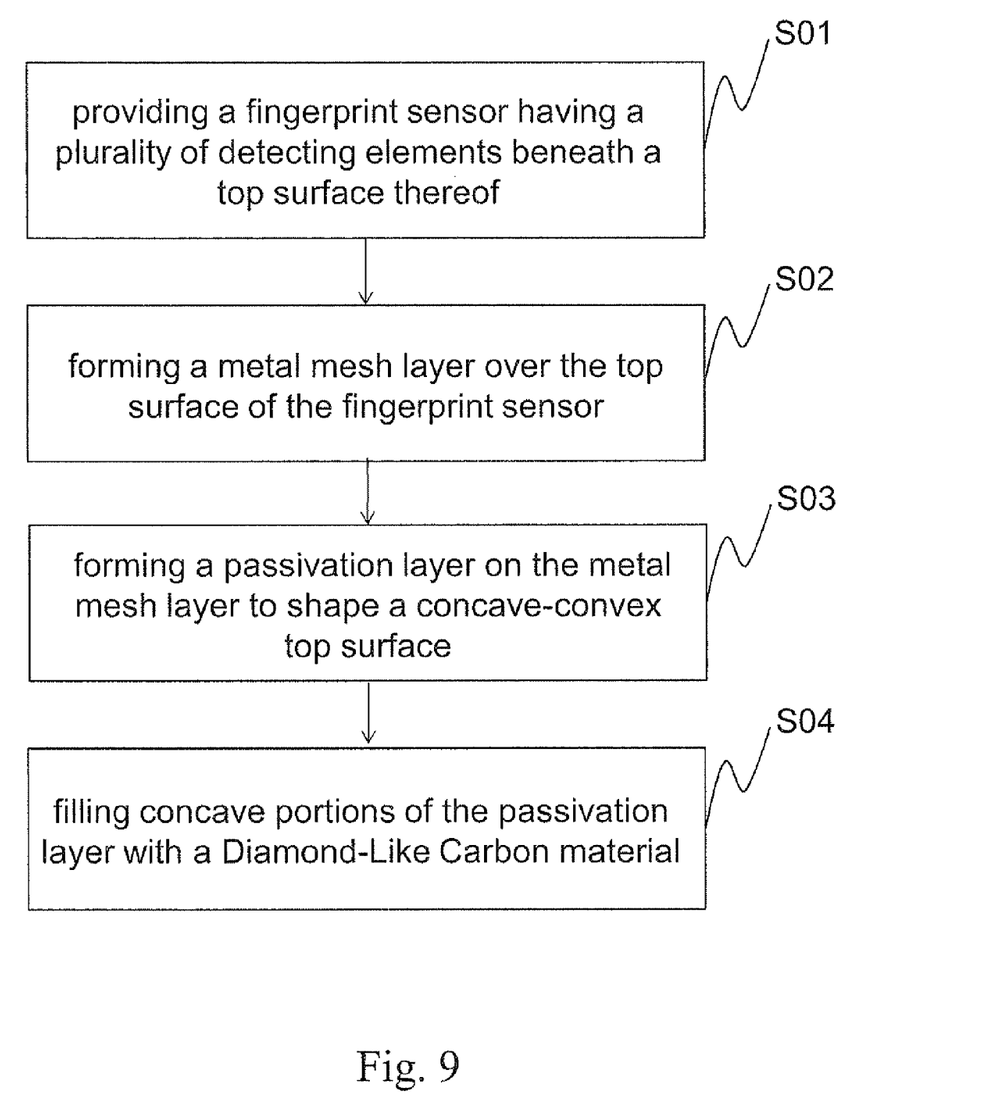
FIG. 9 is a flow chart of the method.

Please refer to FIG. 4 to FIG. 9. FIG. 4 shows a protective structure 200 for enhancing surface characteristics of a fingerprint sensor 100 according to the present invention. It is a partial cross-sectional view of the protective structure 200 and fingerprint sensor 100. FIGS. 5 to 8 illustrate steps of a method for forming the protective structure 200 and FIG. 9 summarizes the steps as a flow chart for the method.

The protective structure 200 has three main parts, a metal mesh layer 210, a passivation layer 220 and Diamond-Like Carbon (DLC) protective portions 230. The protective structure 200 is formed over the fingerprint sensor 100. Before the protective structure 200 is described, it is important to understand the structure of the fingerprint sensor 100 which can be applied by the protective structure 20.

The fingerprint sensor 100 has a number of detecting elements 110 beneath its top surface. The detecting element 110 is used to detect changes of capacitance over a portion of a finger. The arrangement of the detecting elements 110 in the fingerprint sensor 100 is a matrix. It can be used for a static state capacitance type fingerprint sensor (finger staying on the fingerprint sensor for fetching an image of a fingerprint) or a sliding type fingerprint sensor (finger sliding over the fingerprint sensor for fetching images of a fingerprint sequentially). FIG. 4 shows there are three detecting elements 110. It should be noticed that the figure is just used for illustration purpose. In fact, the quantity of the detecting elements 110 in a cross-section may be hundreds to thousands, depending on its design. Sizewise, the longest side of each detecting element 110 may range from 10 to 40 μm.

After the fingerprint sensor 100 is introduced, the structures of the protective structure 200 are illustrated below. The metal mesh layer 210 is formed over a top surface of the fingerprint sensor 100 and composed of many metal lines intersected in two directions. Preferably, the metal lines in the two directions are substantially intersected vertically. Of course, according to different layout of detecting elements 110, the angel of the intersection may vary. For example, 60° or 45°.

The metal mesh layer 210 can provide Electrostatic Discharge (ESD) protection for the fingerprint sensor 100 by leading the electrostatic to bypass the fingerprint sensor 100 to grounding. The metal mesh layer 210 is made of aurum for better conductibility. In practice, it can also be made of aluminum, copper, aluminum alloy or copper alloy. Since the detecting element 110 may range from 10 to 40 μm, preferably, a distance between two adjacent metal lines of the metal mesh layer 210 is 10 to 50 μm. According to the spirit of the present invention, metal lines of the metal mesh layer 210 are formed periodically. In other words, they are periodically formed because each of them is located between two adjacent detecting elements 110 while the detecting elements 110 are arranged periodically. In this embodiment, height of each metal line is substantially greater than 1 μm. In fact, 1 μm is the minimum height for the metal lines. Similarly, width of the metal lines is at least 1 μm. The cross section of the metal lines based on above dimensions is suitable for the manufacturing of other parts of the protective structure 200.

The passivation layer 220 is formed on the metal mesh layer 210. A concave-convex top surface is shaped on the passivation layer 220. Because the passivation layer 220 is formed by depositing, uniform deposits on the surface of the metal mesh layer 210 and partial fingerprint sensor 100 will be ups and downs accordingly. Not like other inventions, the present invention doesn't ask the passivation layer 220 to be planarized before further process takes place on the passivation layer 220, e.g. forming a protective layer. Instead, the protective structure 200 utilizes the concave portions of the top surface to form the DLC protective portion 230. Thus, the DLC protective portion 230 can be firmly attached to the protective structure 200 in the concave portion. The DLC protective portions 230 will not cause cracks as they are linked to be a "layer".

As to location, convex portions of the passivation layer 220 are substantially above the metal lines of the metal mesh layer 210. In this embodiment, the passivation layer 220 is made of Polyimide (PI) by depositing. In practice, it can be made of $SiO_2$, $Al_2O_3$, SIC or SiN. Functions of the passivation layer 220 are to provide resistance against external pressure to protect the fingerprint sensor 100, and be electrically isolated from outside environment. However, the passivation layer 220 is not scratchable. The protective portions 230 can be complementary to this weakness. Thickness of concave portions of the passivation layer 220 is better to be around 1 μm. It may range from 0.5 μm to 2 μm. Thickness of convex portions of the passivation layer 220 is also around 1 μm.

The DLC protective portions 230 are formed of a DLC material. It is carbon in different patterns of crystallization. The protective portions 230 formed in the concave portions of the passivation layer 220 to enhance the hardness of the protective structure 200. The DLC material can further include hydrogen or nitrogen to adjust hardness of the protective structure 200. From the top view of the protective structure 200, it can be seen that the top surface of the protective structure 200 is formed by portions of passivation layer 220 and the DLC protective portions 230 interleavedly. This structure is stain-proof and water-proof.

A method to form the protective structure 200 is shown by a flow chart in FIG. 9. Please refer to FIG. 5 to FIG. 8. The method is illustrated as below. First, provide the fingerprint sensor 100 which has a number of detecting elements 110 beneath the top surface of the fingerprint sensor 100 (S01, FIG. 5). The detecting element 110 is used to detect changes of capacitance over a portion of a finger. Then, the metal mesh layer 210 is formed over the top surface of the fingerprint sensor 210 (S02, FIG. 6). The metal lines of the metal mesh layer 210 are formed periodically and each of them is located between two adjacent detecting elements 110. Next, form the passivation layer 220 on the metal mesh layer 210 to shape the concave-convex top surface (S03, FIG. 7). Finally, fill concave portions of the passivation layer 220 with a DLC material to form the DLC protective portions 230 (S04, FIG. 8). Convex portion of the passivation layer 220 is substantially above the metal line of the metal mesh layer 210.

While the invention has been described in terms of what is presently considered to be the most practical and preferred embodiment, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for enhancing surface characteristics of a fingerprint sensor, comprising the steps of:
   providing a fingerprint sensor having a plurality of detecting elements beneath a top surface thereof, the detecting element being used to detect changes of capacitance over a portion of a finger;
   forming a metal mesh layer over the top surface of the fingerprint sensor, wherein metal lines of the metal mesh layer are formed periodically and each of them is located between two adjacent detecting elements;
   forming a passivation layer on the metal mesh layer to shape a concave-convex top surface; and
   filling concave portions of the passivation layer with a Diamond-Like Carbon (DLC) material,
   wherein a convex portion of the passivation layer is substantially above the metal line of the metal mesh layer.

2. The method according to claim 1, wherein the passivation layer is made of $SiO_2$, $Al_2O_3$, SIC, SiN or a Polyimide (PI).

3. The method according to claim 1, wherein the metal mesh layer is made of aurum, aluminum, copper, aluminum alloy or copper alloy.

4. The method according to claim 1, wherein a distance between two adjacent metal lines is 10 to 50 μm.

5. The method according to claim 1, wherein a height of the metal line is at least 1 μm.

6. The method according to claim 1, wherein a width of the metal line is at least 1 μm.

7. The method according to claim 1, wherein a thickness of concave portions of the passivation layer is around 1 μm.

8. The method according to claim 1, wherein a thickness of convex portions of the passivation layer is around 1 μm.

9. The method according to claim 1, wherein the DLC material comprises hydrogen or nitrogen to adjust hardness thereof.

10. A structure for enhancing surface characteristics of a fingerprint sensor, comprising:
    a metal mesh layer, over a top surface of a fingerprint sensor, for providing Electrostatic Discharge (ESD) protection for the fingerprint sensor;
    a passivation layer, formed on the metal mesh layer to shape a concave-convex top surface thereon; and
    DLC protective portions, formed of a DLC material, formed in the concave portions of the passivation layer,
    wherein the fingerprint sensor has a plurality of detecting elements beneath a top surface thereof; the detecting element is used to detect changes of capacitance over a portion of a finger; metal lines of the metal mesh layer are formed periodically and each of them is located between two adjacent detecting elements; and a convex portion of the passivation layer is substantially above the metal line of the metal mesh layer.

11. The structure according to claim 10, wherein the passivation layer is made of $SiO_2$, $Al_2O_3$, SIC, SiN or a Polyimide (PI).

12. The structure according to claim 10, wherein the metal mesh layer is made of aurum, aluminum, copper, aluminum alloy or copper alloy.

13. The structure according to claim 10, wherein a distance between two adjacent metal lines is 10 to 50 μm.

14. The structure according to claim 10, wherein a height of the metal line is at least 1 μm.

15. The structure according to claim 10, wherein a width of the metal line is at least 1 μm.

16. The structure according to claim 10, wherein a thickness of concave portions of the passivation layer is around 1 μm.

17. The structure according to claim 10, wherein a thickness of convex portions of the passivation layer is around 1 μm.

18. The structure according to claim 10, wherein the DLC material comprises hydrogen or nitrogen to adjust hardness thereof.

* * * * *